US010903818B2

(12) United States Patent
Nair et al.

(10) Patent No.: US 10,903,818 B2
(45) Date of Patent: *Jan. 26, 2021

(54) PIEZOELECTRIC PACKAGE-INTEGRATED FILM BULK ACOUSTIC RESONATOR DEVICES

(71) Applicant: Intel Corporation, Santa Clara, CA (US)

(72) Inventors: Vijay K. Nair, Mesa, AZ (US); Feras Eid, Chandler, AZ (US); Adel A. Elsherbini, Chandler, AZ (US); Telesphor Kamgaing, Chandler, AZ (US); Georgios C. Dogiamis, Gilbert, AZ (US); Valluri R. Rao, Saratoga, CA (US); Johanna M. Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 1032 days.

This patent is subject to a terminal disclaimer.

(21) Appl. No.: 15/089,001

(22) Filed: Apr. 1, 2016

(65) Prior Publication Data
US 2017/0285695 A1   Oct. 5, 2017

(51) Int. Cl.
*H03H 9/54*   (2006.01)
*H03H 9/05*   (2006.01)
(Continued)

(52) U.S. Cl.
CPC ............... *H03H 9/54* (2013.01); *G06F 1/18* (2013.01); *H03H 9/05* (2013.01); *H03H 9/0542* (2013.01);
(Continued)

(58) Field of Classification Search
CPC .......... G06F 1/18; H03H 9/587; H03H 9/542; H03H 9/0557; H03H 9/545; H03H 9/56; H03H 9/5042; H03H 9/54
(Continued)

(56) References Cited

U.S. PATENT DOCUMENTS 6,130,590 A    10/2000  Kolsrud
8,084,919 B2   12/2011  Nishihara et al.
(Continued)

FOREIGN PATENT DOCUMENTS

CN        1610254       4/2005
DE    10 2014 111909    2/2016

OTHER PUBLICATIONS

Office Action from Taiwan Patent Application No. 106104737, dated Feb. 19, 2020, 9pgs.
(Continued)

*Primary Examiner* — Robert J Pascal
*Assistant Examiner* — Jorge L Salazar, Jr.
(74) *Attorney, Agent, or Firm* — Schwabe, Williamson & Wyatt, P.C.

(57) ABSTRACT

Embodiments of the invention include a piezoelectric package integrated filtering device that includes a film stack. In one example, the film stack includes a first electrode, a piezoelectric material in contact with the first electrode, and a second electrode in contact with the piezoelectric material. The film stack is suspended with respect to a cavity of an organic substrate having organic material and the film stack generates an acoustic wave to be propagated across the film stack in response to an application of an electrical signal between the first and second electrodes.

26 Claims, 8 Drawing Sheets

(51) Int. Cl.
 *H03H 9/58* (2006.01)
 *G06F 1/18* (2006.01)
 *H03H 9/56* (2006.01)
(52) U.S. Cl.
 CPC .......... *H03H 9/0557* (2013.01); *H03H 9/542* (2013.01); *H03H 9/545* (2013.01); *H03H 9/56* (2013.01); *H03H 9/587* (2013.01)
(58) Field of Classification Search
 USPC ........................................ 333/186, 187, 188
 See application file for complete search history.

(56) References Cited

U.S. PATENT DOCUMENTS

| | | | | |
|---|---|---|---|---|
| 8,816,567 | B2* | 8/2014 | Zuo | ................ H03H 3/02 310/321 |
| 2003/0227357 | A1* | 12/2003 | Metzger | ............ H03H 9/0571 333/189 |
| 2007/0296513 | A1* | 12/2007 | Ruile | ................. H03B 5/1841 331/116 R |
| 2009/0108381 | A1* | 4/2009 | Buchwalter | ........... B81C 1/0023 257/415 |
| 2009/0224851 | A1 | 9/2009 | Feiertag et al. | |
| 2011/0187227 | A1* | 8/2011 | Chen | ................... H03H 3/007 310/318 |
| 2012/0086522 | A1 | 4/2012 | Mao et al. | |
| 2012/0148870 | A1* | 6/2012 | Liu | ................... B81C 1/00269 428/641 |
| 2013/0140959 | A1 | 6/2013 | Shin et al. | |
| 2014/0111064 | A1 | 4/2014 | Zuo et al. | |
| 2014/0312993 | A1 | 10/2014 | Nam et al. | |
| 2015/0295559 | A1 | 10/2015 | White et al. | |
| 2015/0381144 | A1 | 12/2015 | Bradley et al. | |
| 2016/0204755 | A1* | 7/2016 | Kando | ................... H03H 5/12 333/175 |

OTHER PUBLICATIONS

Hakemi G et al: "Suitability of Liquid Crystal Polymer Substrates for high frequency acoustic devices", Elsevier Procedia Chemistry, vol. 1, No. 1, Sep. 2009 (Sep. 2009), pp. 72-75, XP026799485, [retrieved on Sep. 1, 2009].

Jim Stratigos et al: "Organically Grown Wireless SiP Solutions", Advanced Packaging, May 1, 2008 (May 1, 2008), XP055631128.

International Search Report and written opinion for International Patent Application No. PCT/US2017/017703, dated May 30, 2017, 15 pages.

Warder Phil et al: "Golden Age for Filter Design: Innovative and Proven Approaches for Acoustic Filter, Duplexer, and Multiplexer Design", IEEE Microwave Magazine, vol. 16, No. 7, Aug. 1, 2015 (Aug. 1, 2015) , pp. 60-72, XP011662653, [retrieved on Jul. 8, 2015].

Lim S P et al: "High-Level Embedded Passive Triplexer and Quintplexer Module into Organic Packaging Substrate", European Microwave Conference, Oct. 2008 (Oct. 2008), pp. 638-641, XP031407240.

Xiangyin Zeng et al: "Integrated RF Passive Filtering Circuits in Organic Package Substrate", IEEE International Symposium on High Density Packaging and Microsystem Integration, Jun. 2007 (Jun. 2007), pp. 1-3, XP031122924.

Search Report for European Patent Application No. 17776106.1, dated Oct. 21, 2019, 12 pages.

International Preliminary Search Report for International Patent Application No. PCT/US2017/017703, dated Oct. 11, 2018, 12 pages.

Notice of Allowance from Taiwan Patent Application No. 106104737, dated Aug. 26, 2020, 4 pgs.

* cited by examiner

PIEZOELECTRIC PACKAGE-INTEGRATED FILM BULK ACOUSTIC RESONATOR DEVICES

FIELD OF THE INVENTION

Embodiments of the present invention relate generally to package integrated devices. In particular, embodiments of the present invention relate to piezoelectric package integrated film bulk acoustic resonator (FBAR) devices.

BACKGROUND OF THE INVENTION

Filters are essential components of today's wireless circuits to enable, for example, band selection and frequency tuning. Future wireless systems, like 5G system, will have a large number of filters or a few tunable super-filters to enable inter-band, intra-band and multiprotocol mobile service. FIG. 1 shows a generic schematic of a multi-band, multi-protocol wireless system 102. This architecture shows 14 filters. In future systems more filters will be needed since those systems will have more frequency bands and protocols. In order to build efficient 5G systems, innovative high quality filters have to be designed and implemented in very small form factors. In the traditional approach used in RF front-end modules, the filters are fabricated as separate components and assembled either on to the board or on the package. Some filters today are realized using integrated passive (resistor, capacitor, and/or inductor) networks which suffer from large size and high losses due to the quality factors of inductors in addition to the need for additional process steps to assemble those components onto the package substrate. In some other cases, filter components are fabricated using glass or low temperature co-fired ceramic (LTCC) substrates, which are typically expensive because of the base substrate material used and generally require a separate and large package that is assembled onto the printed circuit board.

Another approach employs Silicon Micro Electromechanical Systems (Si-MEMS) based resonators that can be made smaller and have higher quality factors than discrete passive networks; however their fabrication, which requires micromachining of expensive materials, may be cost-prohibitive and they would still require assembly as discrete components to the package and/or system board.

DETAILED DESCRIPTION OF THE INVENTION

Figure 1:
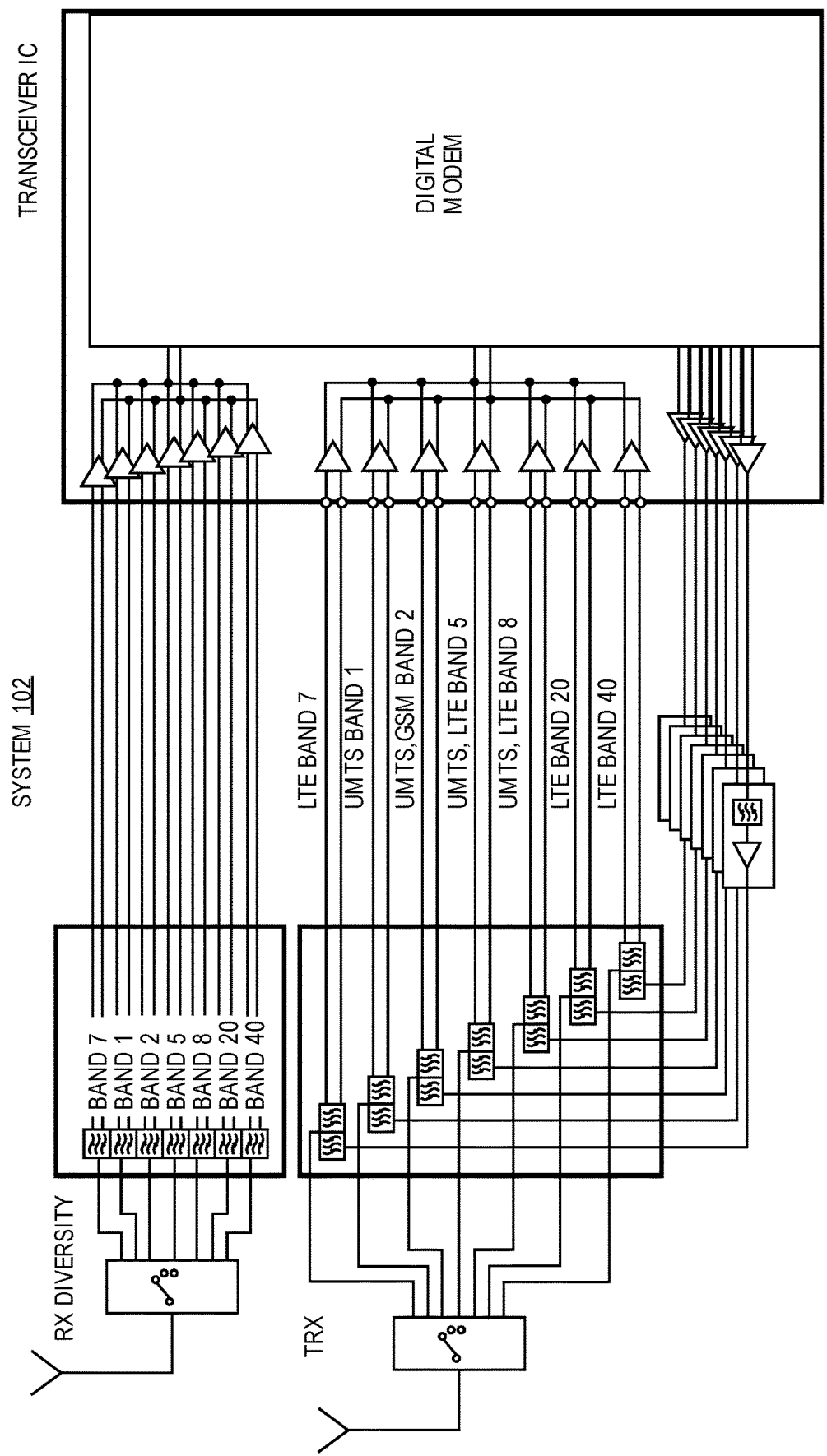
FIG. 1 shows a generic schematic of a multi-band, multi-protocol wireless system.

Described herein are piezoelectric package integrated electromechanical filters (e.g., film bulk acoustic resonator (FBAR) filter devices) in a package substrate. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order to not obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Some filters today utilize integrated passive (resistor, capacitor, and/or inductor) networks which suffer from large size and low quality factors. Silicon micro-electromechanical system (MEMS) resonators can be made smaller and have higher quality factors than passive filter networks, however their fabrication may be expensive due to the wafer-level nature of Si-MEMS processing. In addition, both of those approaches (integrated passive networks and Si-MEMS resonators) require assembly of components to the package and/or system board. The present design includes an architecture that allows in-situ fabrication of filter devices in a compact form factor on package substrates using organic panel-level (e.g., approximately 0.5 m×0.5 m sized panels) high volume manufacturing technology, without requiring the assembly of external bulky components or expensive Si MEMS fabrication.

The present design addresses the fabrication of filter devices within the semiconductor package substrate that is compatible with high volume package substrate fabrication technology. This present design for FBAR filter devices integrated in a package substrate is based on our ability to deposit piezoelectric materials in the package substrate and create vibrating structures in the substrate.

In one embodiment, this technology allows the fabrication of micro-electromechanical piezoelectric filter devices utilizing substrate manufacturing technology. These filter devices include suspended vibrating structures. The structures contain stacks of piezoelectric material and electrodes that can be used to apply an electrical signal (e.g., a voltage) to the piezoelectric layer. Applying a time-varying (e.g., AC) voltage across the electrodes produces a stress in the piezoelectric material, causing the stack, and thus the entire released structure to vibrate. At a certain resonance an acoustic wave starts to propagate across the stack parallel to the electric field. This acoustic wave is reflected at electrode/air interfaces. In the ideal case, the device allows signals whose frequency matches one of the device's resonant mechanical frequencies to pass through. One or more of those devices can therefore be used to act as different types of filters for incoming signals, such as low-pass filters, high pass filters, band pass filters, etc.

The present design results in package-integrated filter devices, thus enabling smaller and thinner systems in comparison to discrete filter devices attached to a substrate. The package-integrated filter devices do not add a Z height (along the vertical axis) to a total height of a substrate or multiple substrates. This present design can be manufactured as part of the package substrate fabrication process with no need for purchasing and assembling discrete components. It therefore enables high volume manufacturability (and thus lower costs) of systems that need filter devices (e.g., RF filters, etc).

In one example, the present design includes package-integrated structures to act as radio frequency (RF) filter devices. Those structures are manufactured as part of the package layers and air/solid interfaces are created by removing the dielectric material around those structures. The structures include piezoelectric stacks that are deposited and patterned layer-by-layer into the package stackup. The present design includes creating functional filters in the package on the principle of suspended and vibrating structures. The package build-up dielectric material may be selectively removed to create vacuum-filled or air-filled cavities. Piezoelectric material deposition (e.g., 0.5 to 1 um deposition thickness) and crystallization also occurs in the package substrate during the package fabrication process. An annealing operation at a lower substrate temperature range (e.g., up to 260 C) allows crystallization of the piezoelectric material (e.g., lead zirconate titanate (PZT), potassium sodium niobate (KNN), aluminum nitride (AlN), zinc oxide (ZnO), etc) to occur during the package fabrication process. In one example, laser pulse annealing occurs locally with respect to the piezoelectric material for the annealing operation without damaging other layers of the package substrate including organic layers.

The present design is able to create filters with high resonant frequencies (e.g., at least 0.9 GHz, at least 2 GHz, at least 5 GHz, etc) directly in the package without requiring the assembly of discrete components. This present design is advantageous compared to surface acoustic wave (SAW) resonators whose resonant frequencies are controlled by lithographically defined features. Thus, SAW resonators may be limited at an upper frequency of no more than 2 GHz even when using a typical semiconductor process. Another drawback for the SAW technology would be using fine lithographic features that are detrimental to the filter quality factor. The present design enables filters that can be fabricated using organic panel level processing which is less expensive than wafer-level Si MEMS fabrication.

Figure 2:
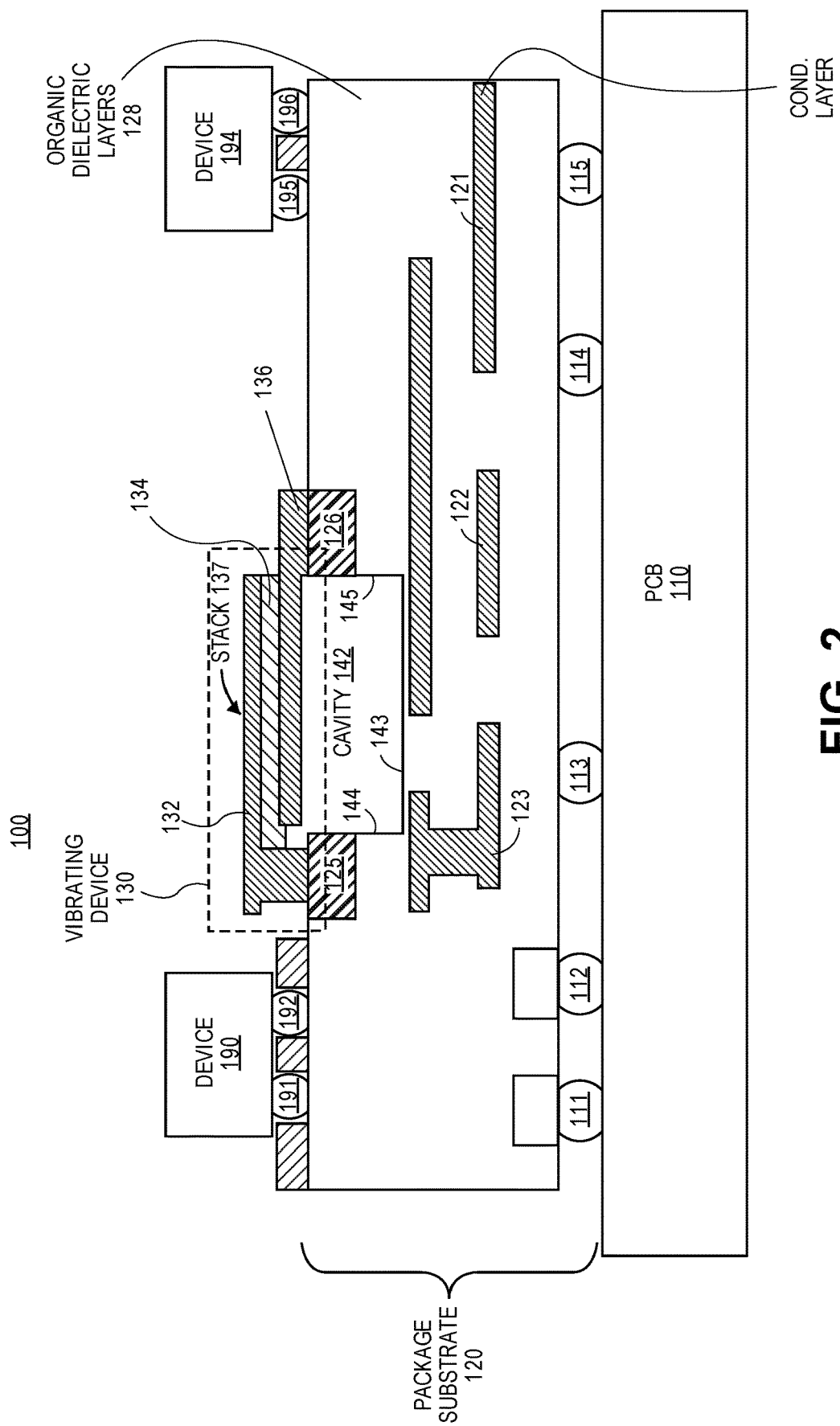
FIG. 2 illustrates a microelectronic device 200 having package-integrated piezoelectric devices, according to an embodiment.

Referring now to FIG. 2, a view of a microelectronic device 100 having package-integrated piezoelectric devices is shown, according to an embodiment. In one example, the microelectronic device 100 includes multiple devices 190 and 194 (e.g., die, chip, CPU, silicon die or chip, radio transceiver, etc.) that are coupled or attached to a package substrate 120 with solder balls 191-192, 195-196. The package substrate 120 is coupled or attached to the printed circuit board (PCB) 110 using, for example, solder balls 111 through 115.

The package substrate 120 (e.g., organic substrate) includes organic dielectric layers 128 and conductive layers 121-123 and 125-126. Organic materials may include any type of organic material including flame retardant 4 (FR4), resin-filled polymers, prepreg (e.g., pre impregnated, fiber weave impregnated with a resin bonding agent), polymers, silica-filled polymers, etc. The package substrate 120 can be formed during package substrate processing (e.g., panel level). The panels formed can be large (e.g., having in-plane dimensions of approximately 0.5 meter by 0.5 meter, or greater than 0.5 meter, etc.) for lower cost. A cavity 142 is formed within the packaging substrate 120 by removing one or more layers (e.g., organic layers, dielectric layers, etc.) from the packaging substrate 120. The cavity 142 includes a lower member 143 and sidewalls 144-145. In one example, a piezoelectric vibrating device 130 is formed with conductive structures 132 and 136 (e.g., cantilevers, beams) and piezoelectric material 134. The three structures 132, 134, and 136 form a stack 137. The conductive layer 132 can act as a first electrode and the conductive layer 136 can act as a second electrode of the piezoelectric vibrating device. The cavity 142 can be air filled or vacuum filled. Applying a voltage across the first and second electrodes causes the stack to be mechanically deformed due to the piezoelectric effect and an acoustic wave propagates across the stack (e.g., across a thickness of the stack) parallel to the electric field. This wave is reflected at the electrode/air interfaces. The resonant frequency of this type of resonator is inversely proportional to the thickness of the stack.

Figures 3A, 3B:
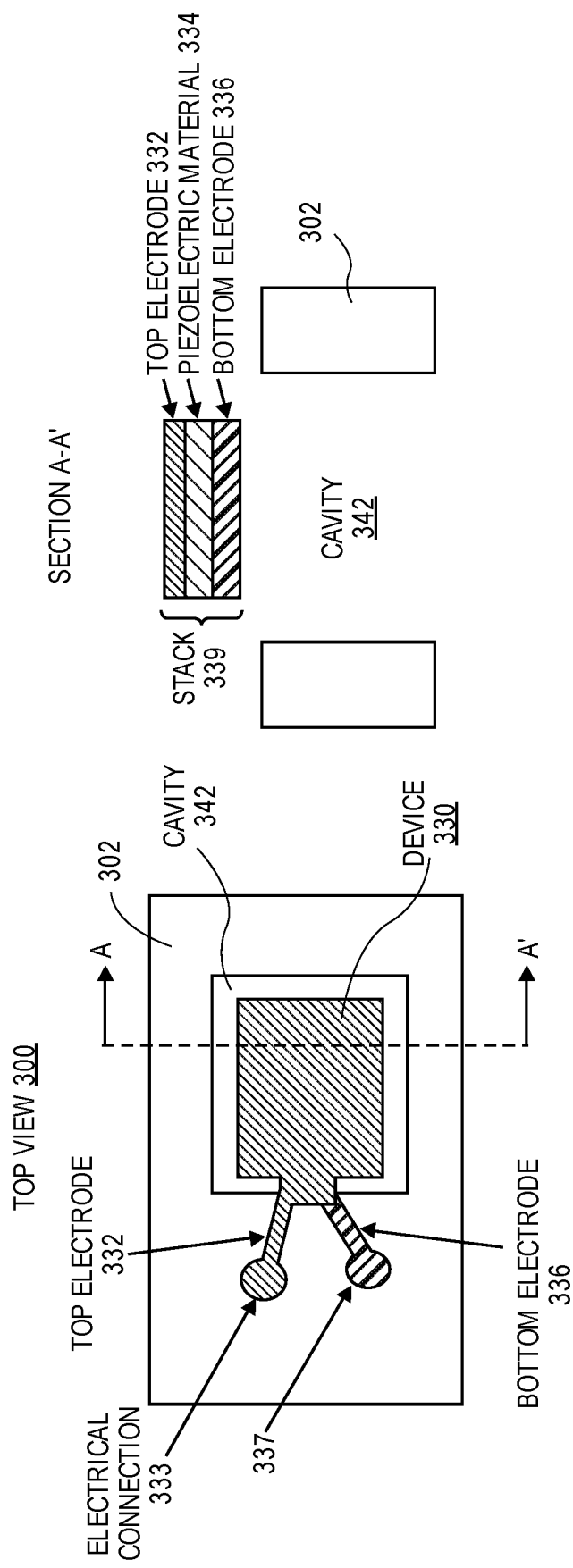
FIG. 3A illustrates a top view 300 of a package substrate having a package-integrated piezoelectric filter device, according to an embodiment.
FIG. 3B illustrates a cross-sectional view AA' of the package substrate 300 of FIG. 3A having a package-integrated piezoelectric filter device, according to an embodiment.

The basic principle includes creating a low power, low cost electromechanical filter using a FBAR piezoelectric resonator integrated in the package substrate. FIG. 3A illustrates a top view 300 of a package substrate having a package-integrated piezoelectric filter device, according to an embodiment. In one example, the package substrate 300 may be coupled or attached to multiple devices (e.g., die, chip, CPU, silicon die or chip, RF transceiver, etc.) and also coupled or attached to a printed circuit board (e.g., PCB 110 in FIG. 2). The package substrate 300 (e.g., organic substrate) includes organic dielectric layers 302 and conductive layers. The package substrate 300 can be formed during package substrate processing (e.g., panel level). A cavity 342 is formed within the package substrate 300 by removing (e.g., reactive ion etching, laser ablation, or other methods) one or more organic dielectric layers from the package substrate 300. In one example, a piezoelectric FBAR filter device 330 (e.g., resonator) is formed with conductive structures 332 and 336 (e.g., top electrode 332, bottom electrode 336) and piezoelectric material 334 (e.g., lead zirconate titanate (PZT), potassium sodium niobate (KNN), aluminum nitride (AlN), zinc oxide (ZnO), etc.) as illustrated in FIG. 3B. The conductive layer 332 can act as a first top electrode and the conductive layer 336 can act as a second bottom electrode of the piezoelectric device. In one example, the piezoelectric material 334 is disposed on the bottom electrode and the top electrode is disposed on the material 334. The cavity 342 can be air filled or vacuum filled. The conductive layer 332 is anchored on one edge by electrical package connections 333 (e.g., anchors, vias) which may serve as both mechanical anchors as well as electrical connections to the rest of the package. The conductive layer 336 is anchored on one edge by package connections 337 (e.g., anchors, vias) which may serve as both mechanical anchors as well as electrical connections to the rest of the package.

FIG. 3B illustrates a cross-sectional view AA' of the package substrate 300 of FIG. 3A having a package-integrated piezoelectric filter device, according to an embodiment. The electrode 332, piezoelectric material 334, and electrode 336 form a stack 339 above the cavity 342. The FBAR filter device 330 (e.g., resonator 330) operates when an electric field is applied between the electrodes 332 and 336 which causes the stack to be mechanically deformed due to the piezoelectric effect and an acoustic wave propagates across the stack (e.g., across a thickness of the stack) parallel to the electric field. This wave is reflected at the electrode/air interfaces on both top and bottom sides of the stack. The resonant frequency of this type of resonator is inversely proportional to the thickness of the structure, which can be made in the few hundreds of nanometers range using existing manufacturing techniques. This makes FBARs well suited for high frequency applications (e.g., at least 2 GHz, at least 5 GHz, at least 30 GHz, etc.). The fundamental resonant frequency is proportional to the duration of the acoustic round trip between the electrodes, which is inversely proportional to the stack thickness. Therefore higher frequencies can be achieved by using thinner stacks.

In contrast, surface acoustic wave (SAW) resonators, have lower central frequencies because their frequencies scale inversely with the lateral (xy) feature sizes. The smallest lateral feature sizes that can be realized with today's package substrate technology are approximately 5-10 um, making SAW filters directly integrated on the package less compatible with high frequency applications (e.g., at least 2 GHz, at least 5 GHz, etc.).

Building FBAR filter devices in the package substrate enables integration with RF front-end integrated circuits (ICs) and modems in a cost effective and power efficient way using a small form factor. The FBAR devices can also be integrated with other on-package components (e.g., passives) to realize compact RF filters. The present design requires the ability to create suspended or moving structures in the package substrate and the ability to deposit and crystallize piezoelectric materials in the package substrate.

Figure 4B:
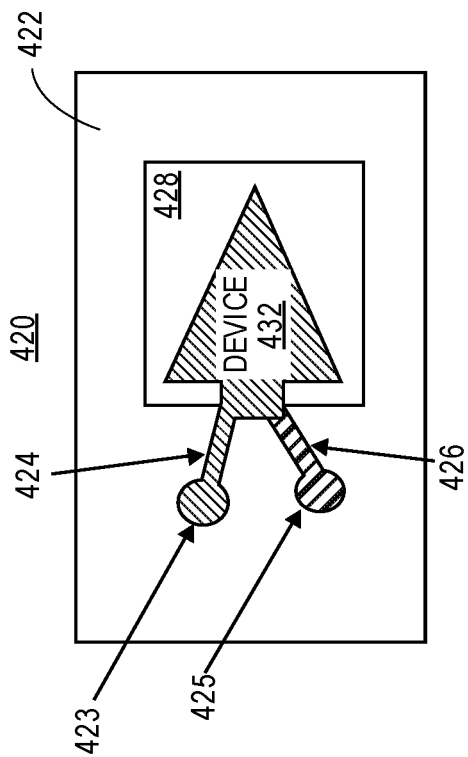
FIGS. 4A-4D illustrate top views of package substrates each having a package-integrated piezoelectric filter device (e.g., resonator) with electrical connections of electrodes on a same side of a cavity according to an embodiment.
Figure 4D:
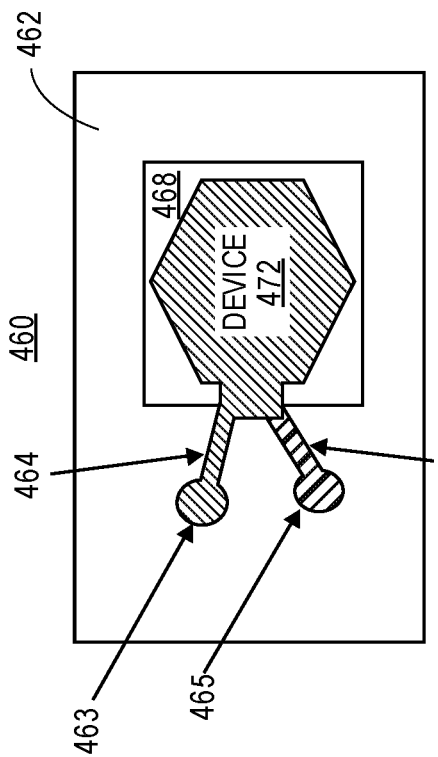
Figure 4A:
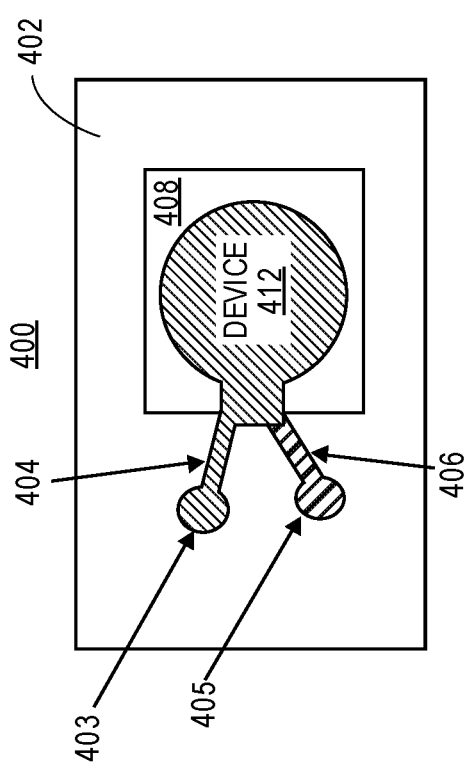
Figure 4C:
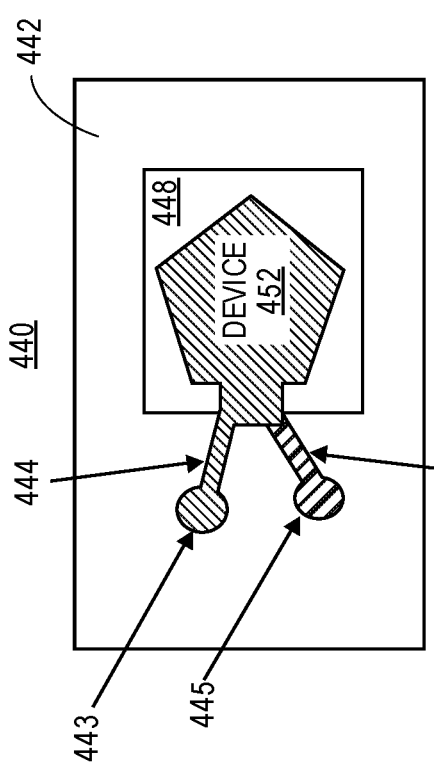

Although the design shown in FIGS. 3A and 3B includes a rectangular plate, any other type of design (e.g., any lithographically defined feature, a circle, a triangle, a pentagon, a hexagon, etc.) is also possible, such as, for example, a circular device structure in FIG. 4A, a triangular device structure in FIG. 4B, a pentagon device structure in FIG. 4C, and a hexagon device structure in FIG. 4D. The electrical connections of the electrodes connecting those structures to other traces or vias in the package for electrical connectivity can be either on the same side (e.g., FIGS. 3A, 4A-4D, 6A) of the structure or on different sides of the structure (e.g., FIGS. 5A and 5B).

FIGS. 4A-4D illustrate top views of package substrates each having a package-integrated piezoelectric filter device (e.g., resonator) with electrical connections of electrodes on a same side of a cavity according to an embodiment. A package substrate 400 (e.g., organic substrate) of FIG. 4A includes organic dielectric layers 402 and conductive layers (e.g., 404, 406). The package substrate 400 can be formed during package substrate processing (e.g., panel level). A piezoelectric stack can include a sandwich configuration in which a piezoelectric material is deposited between two electrodes 404 and 406. A filter device 412 includes the electrode 404, piezoelectric material, and electrode 406 to form a stack above the cavity 408. The electrodes are anchored on one edge by package connections 403 and 405 (e.g., anchors, vias) which may serve as both mechanical anchors as well as electrical connections to the rest of the package.

The natural frequency $f_0$ of a resonant mode of the device 412 is controlled by film thickness of the stack. Due to the electromechanical coupling in the device 412 which is due to the piezoelectric effect, an effective electrical admittance to incoming electrical signals peaks at this natural frequency $f_0$ enabling the device to act as a filter in accordance with one embodiment.

A package substrate 420 (e.g., organic substrate) of FIG. 4B includes organic dielectric layers 422 and conductive layers (e.g., 424, 426). The package substrate 420 can be formed during package substrate processing (e.g., panel level). A piezoelectric stack can include a sandwich configuration in which a piezoelectric material is deposited between two electrodes 424 and 426. A filter device 432 includes the electrode 424, piezoelectric material, and electrode 426 to form a stack above the cavity 428. The electrodes are anchored on one edge by package connections 423 and 425 (e.g., anchors, vias) which may serve as both mechanical anchors as well as electrical connections to the rest of the package.

A package substrate 440 (e.g., organic substrate) of FIG. 4C includes organic dielectric layers 442 and conductive layers (e.g., 444, 446). The package substrate 440 can be formed during package substrate processing (e.g., panel level). A piezoelectric stack can include a sandwich configuration in which a piezoelectric material is deposited between two electrodes 444 and 446. A filter device 452 includes the electrode 444, piezoelectric material, and electrode 446 to form a stack above the cavity 448. The electrodes are anchored on one edge by package connections 443 and 445 (e.g., anchors, vias) which may serve as both mechanical anchors as well as electrical connections to the rest of the package.

A package substrate 460 (e.g., organic substrate) of FIG. 4D includes organic dielectric layers 462 and conductive layers (e.g., 464, 466). The package substrate 460 can be formed during package substrate processing (e.g., panel level). A piezoelectric stack can include a sandwich configuration in which a piezoelectric material is deposited between two electrodes 464 and 466. A filter device 472 includes the electrode 464, piezoelectric material, and electrode 466 to form a stack above the cavity 468. The electrodes are anchored on one edge by package connections 463 and 465 (e.g., anchors, vias) which may serve as both mechanical anchors as well as electrical connections to the rest of the package.

Figure 5A:
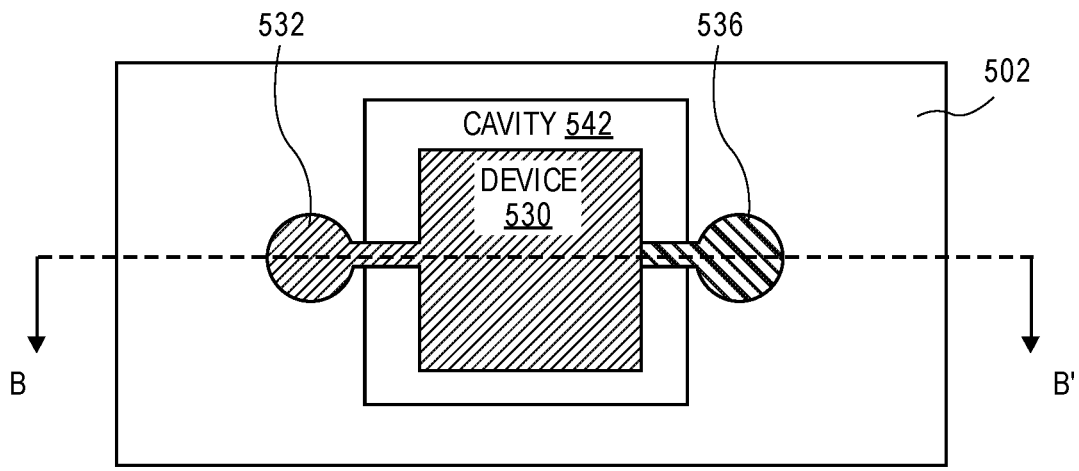
FIG. 5A illustrates a top view of a package substrate 500 having a package-integrated piezoelectric filter device (e.g., resonator) with electrical connections of electrodes on opposite sides of a cavity, according to an embodiment.
Figure 5B:
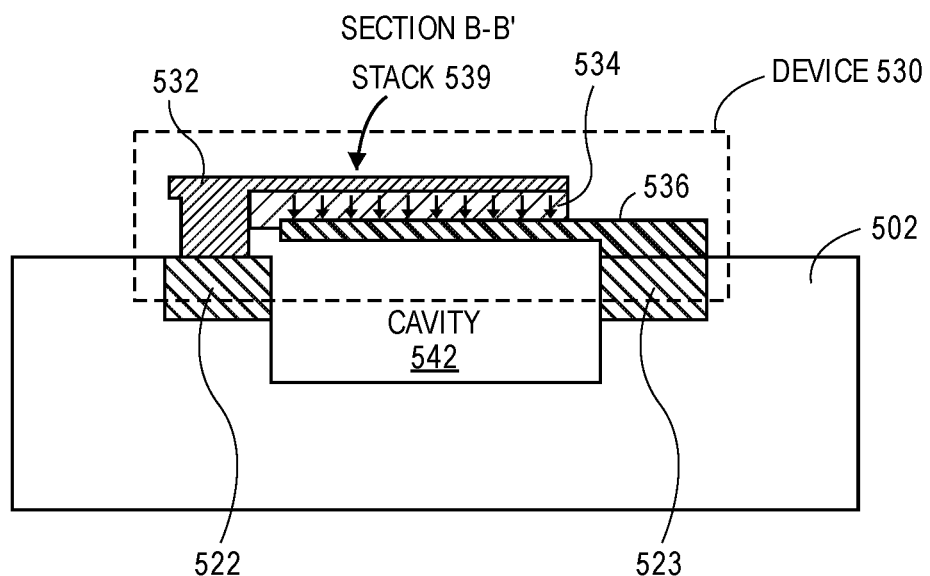
FIG. 5B illustrates a cross sectional view BB' of the piezoelectric device of FIG. 5A in accordance with one embodiment.

FIG. 5A illustrates a top view of a package substrate 500 having a package-integrated piezoelectric filter device (e.g., resonator) with electrical connections of electrodes on opposite sides of a cavity, according to an embodiment. The package substrate 500 (e.g., organic substrate) includes organic dielectric layers 502 and conductive layers (e.g., 532, 536). The package substrate 500 can be formed during package substrate processing (e.g., panel level). A piezoelectric stack 539 can include a sandwich configuration in which a piezoelectric material 534 of FIG. 5B is deposited between two electrodes 532 and 536 located on opposite sides of the cavity 542. A filter device 530 includes the electrode 532, piezoelectric material 534, and electrode 536 to form a stack above the cavity 442.

FIG. 5B illustrates a cross sectional view BB' of the piezoelectric device of FIG. 5A in accordance with one embodiment. The view BB' illustrates an organic dielectric material 502, electrodes 532 and 536, piezoelectric material 534, and a cavity 542. The electrode 532 is anchored on one edge by package connection 522 (e.g., anchors, vias) and the electrode 536 is anchored on another edge by package connection 523 which may serve as both mechanical anchors as well as electrical connections to the rest of the package.

Figure 6:
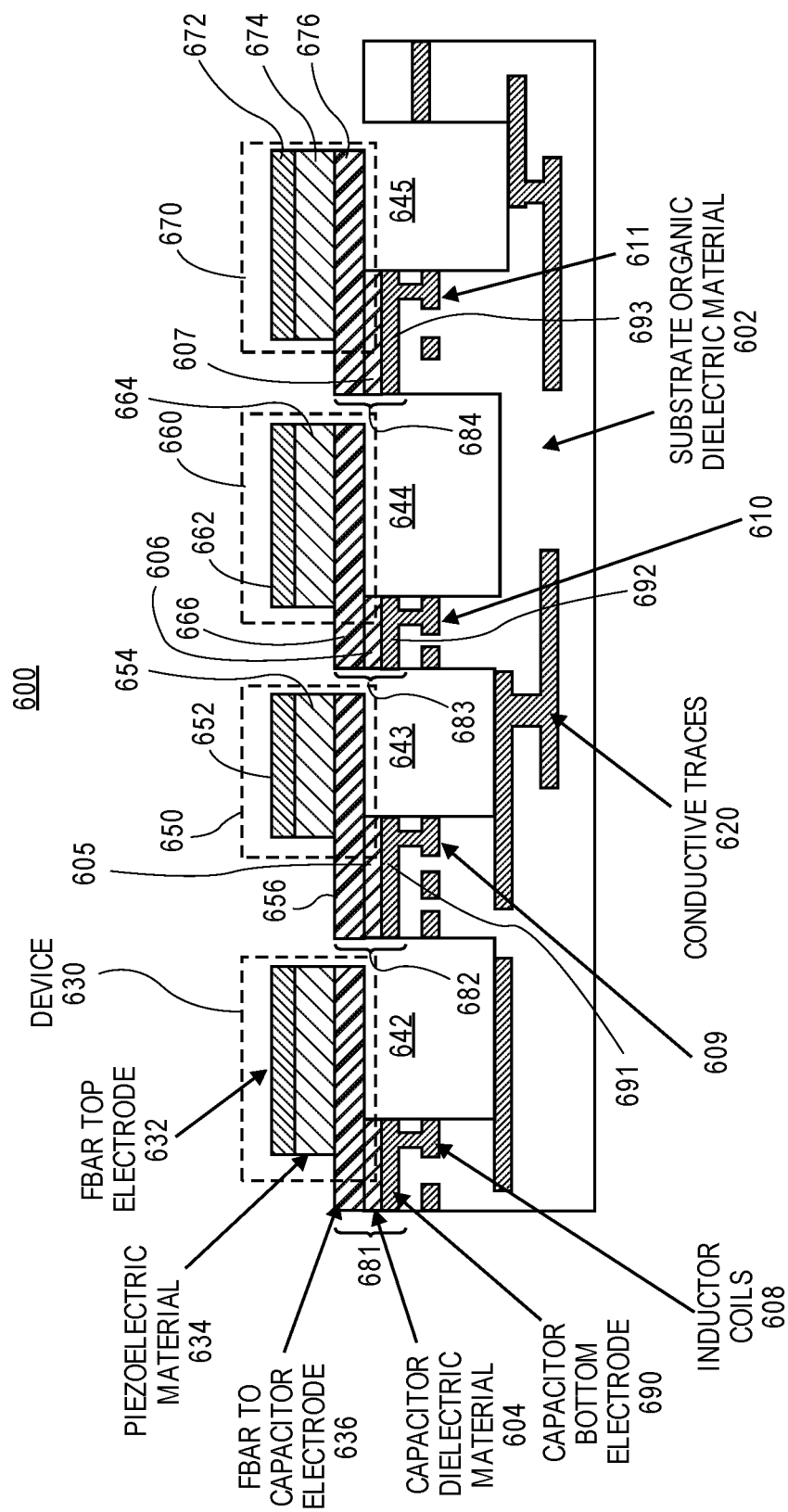
FIG. 6 illustrates a package substrate having—a filter network that includes multiple package-integrated piezoelectric FBAR devices and passive components (e.g., inductors, capacitors) according to an embodiment.

FIG. 6 illustrates a package substrate having—a filter network that includes multiple package-integrated piezoelectric FBAR devices and passive components (e.g., inductors, capacitors) according to an embodiment. In one example, the package substrate 600 may be coupled or attached to multiple devices (e.g., die, chip, CPU, silicon die or chip, etc.) and also coupled or attached to a printed circuit board (e.g., PCB 110). The package substrate 600 (e.g., organic substrate) includes organic dielectric layers 602 and conductive traces (layers) 620. The package substrate 600 can be formed during package substrate processing (e.g., panel level). Cavities 642-645 are formed within the package substrate 600 by removing one or more layers (e.g., organic layers, dielectric layers, etc.) from the package substrate 600. In one example, each piezoelectric FBAR device 630, 650, 660, and 670 is formed with conductive structures (e.g., 632, 636, 652, 656, 662, 666, 672, 676) and piezoelectric material 634, 654, 664, 674, respectively. The conductive structures 632, 652, 662, and 672 can act as top electrodes of the FBAR devices, the conductive structures 636, 656, 666, and 676 can act as bottom electrodes of the FBAR devices and also can act as top electrodes of capacitors 681-684 having capacitor dielectric material 604-607 and capacitor bottom electrodes 690-693. The inductor coils (e.g., 608,609,610 and 611) are formed using conductive traces in the substrate, one end of each inductor coil (e.g., 608, 609,610 and 611) is connected to each of the respective bottom capacitor plates 690-693 and the other end of each coil is connected to other traces or structures in the substrate. The combination of FBAR device, capacitor, and inductor provides the filtering function at the frequency of interest. The cavities can be air filled or vacuum filled.

Figure 7:
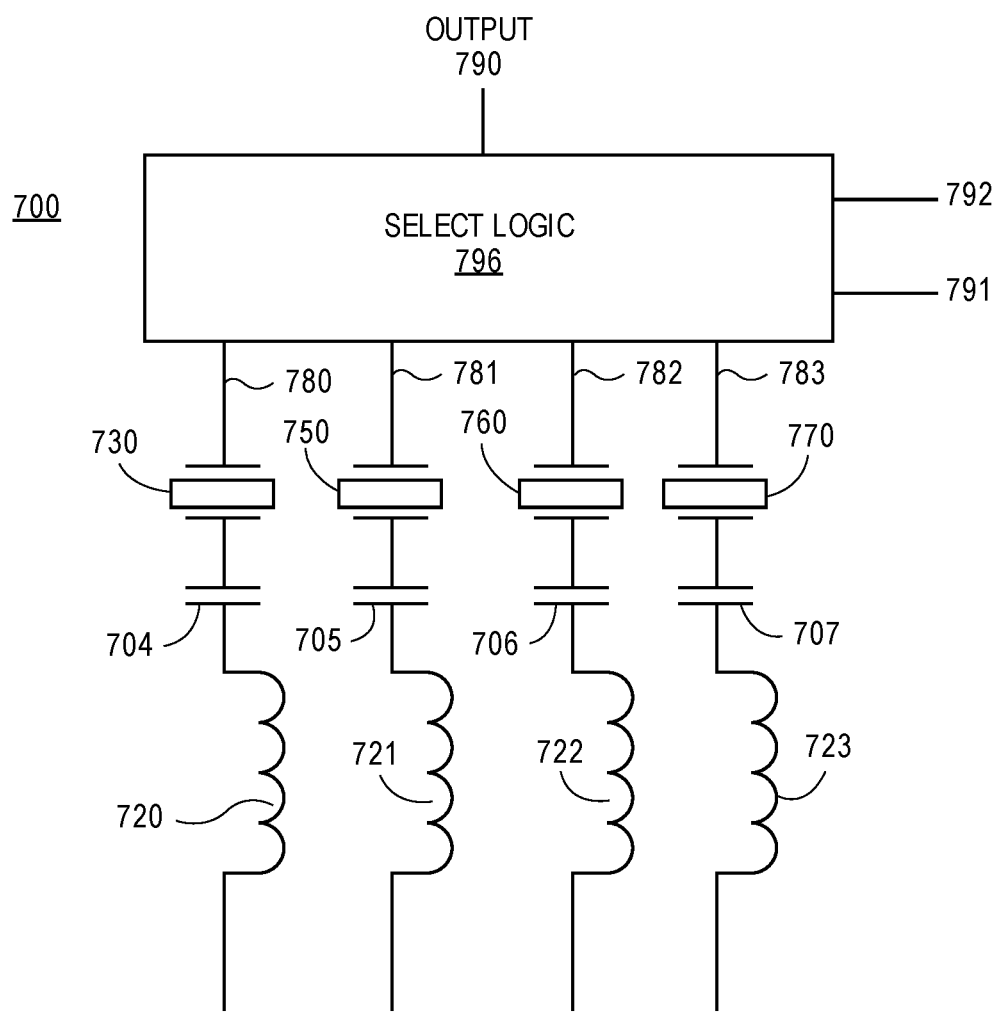
FIG. 7 illustrates the equivalent circuit of an embodiment (e.g., substrate 600 shown in FIG. 6) having multiple filters that include package-integrated piezoelectric FBAR devices and passive components (e.g., inductors, capacitors).

FIG. 7 illustrates the equivalent circuit of an embodiment (e.g., substrate 600 shown in FIG. 6) having multiple filters that include package-integrated piezoelectric FBAR devices and passive components (e.g., inductors, capacitors). The circuit 700 represents the circuit components formed in the package 600 along with select logic 796. The circuit 700 includes FBAR devices 730, 750, 760, and 770, capacitors 704-707, and inductors 720-723. These components can be designed to increase a bandwidth or out of band rejections by properly selecting the values of inductors and capacitors along with a resonance frequency of each resonator.

In one example, a filtering device is formed in a package substrate with circuit 700. The filtering device includes a plurality of a film bulk acoustic wave resonators (e.g., 730, 750, 760, 770) formed in the package substrate with each resonator having a resonant frequency that is inversely proportional to a thickness of a film stack of each resonator which includes a piezoelectric material. Select logic 796 receives inputs 780-783 to generate an output 790 based on select signals 791 and 792. The select logic 796 can select at least one resonator to tune a frequency of the filtering device. The select logic can select each resonator individually or a plurality of resonators simultaneously for tuning the frequency of the filtering device.

It will be appreciated that, in a system on a chip embodiment, the die may include a processor, memory, communications circuitry and the like. Though a single die is illustrated, there may be none, one or several dies included in the same region of the microelectronic device.

In one embodiment, the microelectronic device may be a crystalline substrate formed using a bulk silicon or a silicon-on-insulator substructure. In other implementations, the microelectronic device may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the scope of the present invention.

The microelectronic device may be one of a plurality of microelectronic devices formed on a larger substrate, such as, for example, a wafer. In an embodiment, the microelectronic device may be a wafer level chip scale package (WLCSP). In certain embodiments, the microelectronic device may be singulated from the wafer subsequent to packaging operations, such as, for example, the formation of one or more piezoelectric vibrating devices.

One or more contacts may be formed on a surface of the microelectronic device. The contacts may include one or more conductive layers. By way of example, the contacts may include barrier layers, organic surface protection (OSP) layers, metallic layers, or any combination thereof. The contacts may provide electrical connections to active device circuitry (not shown) within the die. Embodiments of the invention include one or more solder bumps or solder joints that are each electrically coupled to a contact. The solder bumps or solder joints may be electrically coupled to the contacts by one or more redistribution layers and conductive vias.

Figure 8:
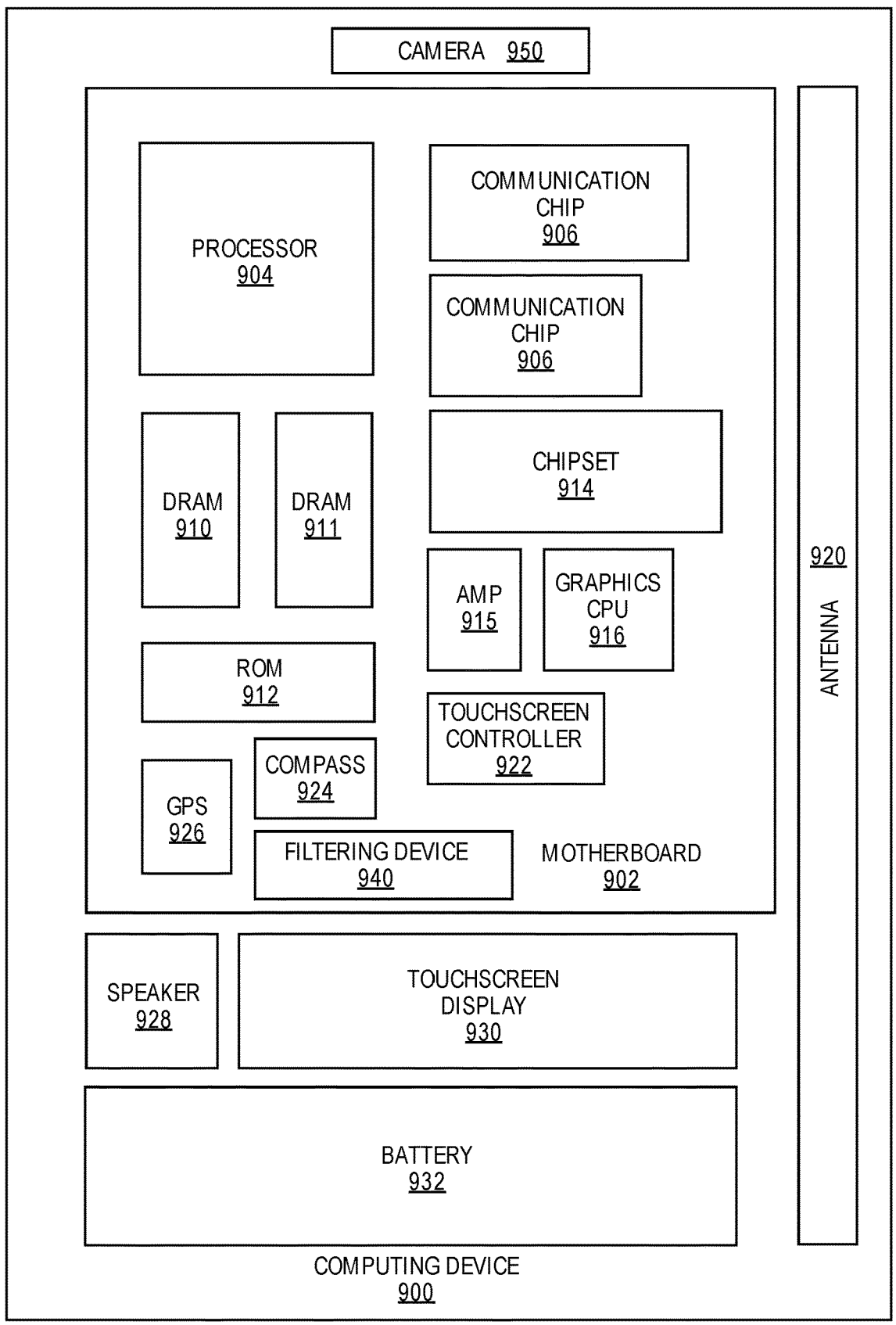
FIG. 8 illustrates a computing device 900 in accordance with one embodiment.

FIG. 8 illustrates a computing device 900 in accordance with one embodiment of the invention. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM 910, 911), non-volatile memory (e.g., ROM 912), flash memory, a graphics processor 916, a digital signal processor, a crypto processor, a chipset 914, an antenna 920, a display, a touchscreen display 930, a touchscreen controller 922, a battery 932, an audio codec, a video codec, a power amplifier 915, a global positioning system (GPS) device 926, a compass 924, a filtering device 940 (e.g., a piezoelectric FBAR device), a gyroscope, a speaker, a camera 950, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi, WiGig and Bluetooth and a second communication chip 906 may be dedicated to longer range wireless communications such as GPS, EDGE, GPRS, CDMA, WiMAX, LTE, Ev-DO, 5G, and others.

The processor 904 of the computing device 900 includes an integrated circuit die packaged within the processor 904. In some implementations of the invention, the processor package includes one or more devices, such as filtering devices in accordance with implementations of embodiments of the invention. The term "processor" may refer to any device or portion of a device that processes electronic data from registers and/or memory to transform that electronic data into other electronic data that may be stored in registers and/or memory. The communication chip 906 also includes an integrated circuit die packaged within the communication chip 906. The following examples pertain to further embodiments.

Example 1 is a filtering device that includes a film stack having a first electrode, a piezoelectric material in contact with the first electrode, and a second electrode in contact with the piezoelectric material. The film stack is suspended with respect to a cavity of an organic substrate having organic material and the film stack generates an acoustic wave to be propagated across the film stack in response to an application of an electrical signal between the first and second electrodes.

In example 2, the subject matter of example 1 can optionally include the filtering device being integrated with the organic substrate which is fabricated with panel level processing.

In example 3, the subject matter of any of examples 1-2 can optionally include the film stack being positioned above the cavity of the organic substrate to allow vibrations of the film stack.

In example 4, the subject matter of any of examples 1-3 can optionally include the acoustic wave being reflected in proximity to interfaces that are between at least one of the first and second electrodes and air.

In example 5, the subject matter of any of examples 1-4 can optionally include the film stack having any type of in-plane shape defined by lithography during fabrication of the panel level organic substrate.

In example 6, the subject matter of any of examples 1-5 can optionally include the filtering device comprises a film bulk acoustic wave resonator formed in the organic substrate with the resonator having a resonant frequency that is inversely proportional to a thickness of at least one of the first and second electrodes and the piezoelectric material of the film stack.

In example 7, the subject matter of any of examples 1-6 can optionally include the first electrode is coupled to a first electrical connection of the organic substrate in proximity to a first end of the cavity of the organic substrate and the second electrode is coupled to a second electrical connection of the organic substrate in proximity to a second end of the cavity.

In example 8, the subject matter of any of examples 1-7 can optionally include the first electrode is coupled to a first electrical connection of the organic substrate in proximity to a first end of the cavity of the organic substrate and the second electrode is coupled to a second electrical connection of the organic substrate in proximity to the first end of the cavity.

Example 9 is a package substrate that includes a plurality of organic dielectric layers and a plurality of conductive layers to form the package substrate, a cavity formed in the package substrate, and a piezoelectric device integrated with the package substrate. The piezoelectric device includes a first electrode, a piezoelectric material in contact with the first electrode, and a second electrode in contact with the piezoelectric material. The piezoelectric device is suspended with respect to the cavity of the organic substrate and the piezoelectric device generates an acoustic wave to be propagated parallel to an electric field caused by an application of an electrical signal between the first and second electrodes.

In example 10, the subject matter of example 9 can optionally include the package substrate being fabricated with panel level processing.

In example 11, the subject matter of any of examples 9-10 can optionally include the piezoelectric device being positioned above the cavity of the organic substrate to allow vibrations of the piezoelectric device.

In example 12, the subject matter of any of examples 9-11 can optionally include the acoustic wave being reflected in proximity to interfaces that are between at least one of the first and second electrodes and air.

In example 13, the subject matter of any of examples 9-12 can optionally include the piezoelectric device has any type of in-plane shape defined by lithography during fabrication of the panel level organic substrate.

In example 14, the subject matter of any of examples 9-13 can optionally include the piezoelectric device comprising a film bulk acoustic wave resonator formed in the organic substrate with the resonator having a resonant frequency that is inversely proportional to a thickness of at least one of the first and second electrodes and the piezoelectric material.

In example 15, the subject matter of any of examples 9-14 can optionally include the first electrode being coupled to a first electrical connection of the package substrate in proximity to a first end of the cavity of the package substrate and the second electrode beings coupled to a second electrical connection of the package substrate in proximity to a second end of the cavity.

In example 16, the subject matter of any of examples 9-15 can optionally include the first electrode being coupled to a first electrical connection of the organic substrate in proximity to a first end of the cavity of the package substrate and the second electrode being coupled to a second electrical connection of the package substrate in proximity to the first end of the cavity.

Example 17 is a computing device that includes at least one processor to process data and a package substrate coupled to the at least one processor. The package substrate includes a plurality of organic dielectric layers and a plurality of conductive layers to form the package substrate which includes a plurality of piezoelectric filtering devices each having a first electrode, a piezoelectric material in contact with the first electrode, and a second electrode in contact with the piezoelectric material. Each piezoelectric filtering device is suspended with respect to a cavity of the package substrate and each piezoelectric filtering device generates an acoustic wave to be propagated parallel to an electric field caused by an application of an electrical signal between the first and second electrodes of each piezoelectric filtering device.

In example 18, the subject matter of example 17 can optionally include the plurality of piezoelectric filtering devices including a first piezoelectric filtering device that is suspended with respect to a first cavity of the package substrate and a second piezoelectric filtering device that is suspended with respect to a second cavity of the package substrate.

In example 19, the subject matter of any of examples 17-18 can optionally include the package substrate further including a plurality of passive components including a plurality of capacitors and a plurality of inductors.

In example 20, the subject matter of example 19 can optionally include the plurality of capacitors and the plurality of inductors including a first capacitor and a first inductor coupled to the first piezoelectric filtering device and a second capacitor and a second inductor coupled to the second piezoelectric filtering device.

In example 21, the subject matter of any of examples 17-20 can optionally include each piezoelectric filtering device being integrated with the package substrate having organic dielectric layers.

In example 22, the subject matter of any of examples 17-21 can optionally include a printed circuit board coupled to the package substrate.

Example 23 is a filtering device formed in a package substrate comprising a plurality of a film bulk acoustic wave resonators formed in the package substrate with each resonator having a resonant frequency that is inversely proportional to a thickness of a film stack of each resonator which includes a piezoelectric material. The filter device also includes a plurality of capacitors with each capacitor being coupled to a respective resonator, a plurality of inductors with each inductor being coupled to a respective capacitor and select logic to select at least one resonator to tune a frequency of the filtering device.

In example 24, the subject matter of example 23 further includes the select logic being able to select each resonator individually or a plurality of resonators simultaneously for tuning the frequency of the filtering device.

In example 25, the subject matter of any of examples 23-24 can optionally include the film stack of each resonator being suspended with respect to a cavity of the package substrate having organic material and the film stack of each resonator generating an acoustic wave to be propagated across the film stack in response to an application of an electrical signal between first and second electrodes of the film stack.

The invention claimed is:

1. A filtering device, comprising:
   a film stack that includes a first electrode, a piezoelectric material in contact with the first electrode, and a second electrode in contact with the piezoelectric material, the piezoelectric material vertically between the first electrode and the second electrode, the first electrode and the second electrode forming an electrode pair, wherein the film stack is suspended with respect to a cavity of an organic substrate having organic material and the film stack generates an acoustic wave to be propagated across the film stack in response to an application of an electrical signal between the first and second electrodes, wherein the first electrode extends only partially across the cavity, and wherein the first electrode is coupled directly to a first conductive structure in the organic substrate, and the second electrode is coupled directly to a second conductive structure in the organic substrate.

2. The filtering device of claim 1, wherein the filtering device is integrated with the organic substrate which is fabricated with panel level processing.

3. The filtering device of claim 1, wherein the film stack is positioned above the cavity of the organic substrate to allow vibrations of the film stack.

4. The filtering device of claim 1, wherein the acoustic wave is reflected in proximity to interfaces that are between at least one of the first and second electrodes and air.

5. The filtering device of claim 1, wherein the film stack has any type of in-plane shape defined by lithography during fabrication of a panel level organic substrate.

6. The filtering device of claim 1, wherein the film stack of the filtering device comprises a film bulk acoustic wave resonator having a resonant frequency that is inversely proportional to a thickness of at least one of the first and second electrodes and the piezoelectric material of the film stack.

7. The filtering device of claim 1, wherein the first electrode is coupled to a first electrical connection of the organic substrate in proximity to a first end of the cavity of the organic substrate and the second electrode is coupled to a second electrical connection of the organic substrate in proximity to a second end of the cavity.

8. The filtering device of claim 1, wherein the first electrode is coupled to a first electrical connection of the organic substrate in proximity to a first end of the cavity of the organic substrate and the second electrode is coupled to a second electrical connection of the organic substrate in proximity to the first end of the cavity.

9. A package substrate comprising:
   a plurality of organic dielectric layers and a plurality of conductive layers to form the package substrate;
   a cavity formed in the package substrate; and
   a piezoelectric device integrated with the package substrate, the piezoelectric device including a first electrode, a piezoelectric material in contact with the first electrode, and a second electrode in contact with the piezoelectric material, the piezoelectric material vertically between the first electrode and the second electrode, the first electrode and the second electrode forming an electrode pair, wherein the first electrode extends only partially across the cavity, wherein the first electrode is coupled directly to a first conductive structure in the package substrate, and the second electrode is coupled directly to a second conductive structure in the package substrate, and wherein the piezoelectric device is suspended with respect to the cavity of the package substrate and the piezoelectric device generates an acoustic wave to be propagated parallel to an electric field caused by an application of an electrical signal between the first and second electrodes.

10. The package substrate of claim 9, wherein the package substrate is fabricated with panel level processing.

11. The package substrate of claim 9, wherein the piezoelectric device is positioned above the cavity of the package substrate to allow vibrations of the piezoelectric device.

12. The package substrate of claim 9, wherein the acoustic wave is reflected in proximity to interfaces that are between at least one of the first and second electrodes and air.

13. The package substrate of claim 9, wherein the piezoelectric device has any type of in-plane shape defined by lithography during fabrication of the panel level organic substrate.

14. The package substrate of claim 9, wherein the piezoelectric device comprises a film bulk acoustic wave resonator formed in the package substrate with the resonator having a resonant frequency that is inversely proportional to a thickness of at least one of the first and second electrodes and the piezoelectric material.

15. The package substrate of claim 9, wherein the first electrode is coupled to a first electrical connection of the package substrate in proximity to a first end of the cavity of the package substrate and the second electrode is coupled to a second electrical connection of the package substrate in proximity to a second end of the cavity.

16. The package substrate of claim 9, wherein the first electrode is coupled to a first electrical connection of the package substrate in proximity to a first end of the cavity of the package substrate and the second electrode is coupled to a second electrical connection of the package substrate in proximity to the first end of the cavity.

17. A computing device comprising:
at least one processor to process data; and
a package substrate coupled to the at least one processor, the package substrate including a plurality of organic dielectric layers and a plurality of conductive layers to form the package substrate which includes a plurality of piezoelectric filtering devices each having a first electrode, a piezoelectric material in contact with the first electrode, and a second electrode in contact with the piezoelectric material, the piezoelectric material vertically between the first electrode and the second electrode, the first electrode and the second electrode forming an electrode pair, wherein each piezoelectric filtering device is suspended with respect to a cavity of the package substrate and each piezoelectric filtering device generates an acoustic wave to be propagated parallel to an electric field caused by an application of an electrical signal between the first and second electrodes of each piezoelectric filtering device, wherein the first electrode extends only partially across the cavity, and wherein the first electrode is coupled directly to a first conductive structure in the package substrate, and the second electrode is coupled directly to a second conductive structure in the package substrate.

18. The computing device of claim 17, wherein the plurality of piezoelectric filtering devices include a first piezoelectric filtering device that is suspended with respect to a first cavity of the package substrate and a second piezoelectric filtering device that is suspended with respect to a second cavity of the package substrate.

19. The computing device of claim 18, wherein the package substrate further comprises a plurality of passive components including a plurality of capacitors and a plurality of inductors.

20. The computing device of claim 19, wherein the plurality of capacitors and the plurality of inductors include a first capacitor and a first inductor coupled to the first piezoelectric filtering device and a second capacitor and a second inductor coupled to the second piezoelectric filtering device.

21. The computing device of claim 17, wherein each piezoelectric filtering device is integrated with the package substrate having organic dielectric layers.

22. The computing device of claim 17, further comprising:
a printed circuit board coupled to the package substrate.

23. A filtering device formed in a package substrate, comprising:
a plurality of a film bulk acoustic wave resonators formed in the package substrate with each resonator having a resonant frequency that is inversely proportional to a thickness of a film stack of each resonator which includes a piezoelectric material, the film stack of each resonator further comprising a first electrode, the piezoelectric material in contact with the first electrode, and a second electrode in contact with the piezoelectric material, the piezoelectric material vertically between the first electrode and the second electrode, the first electrode and the second electrode forming an electrode pair, and the package substrate including a plurality of organic dielectric layers and a plurality of conductive layers to form the package substrate;
a plurality of capacitors with each capacitor being coupled to a respective resonator;
a plurality of inductors with each inductor being coupled to a respective capacitor; and
select logic to select at least one resonator to tune a frequency of the filtering device.

24. The filtering device of claim 23, wherein the select logic can select each resonator individually or a plurality of resonators simultaneously for tuning the frequency of the filtering device.

25. The filtering device of claim 23, wherein the film stack of each resonator is suspended with respect to a cavity of the package substrate having organic material and the film stack of each resonator generates an acoustic wave to be propagated across the film stack in response to an application of an electrical signal between first and second electrodes of the film stack.

26. A filtering device, comprising:
a film stack that includes a first electrode, a piezoelectric material in contact with the first electrode, and a second electrode in contact with the piezoelectric material, the piezoelectric material vertically between the first electrode and the second electrode, the first electrode and the second electrode forming an electrode pair, wherein the film stack is suspended with respect to a cavity of an organic substrate having organic material and the film stack generates an acoustic wave to be propagated across the film stack in response to an application of an electrical signal between the first and second electrodes, wherein the first electrode is coupled to a first electrical connection of the organic substrate in proximity to a first end of the cavity of the organic substrate and the second electrode is coupled to a second electrical connection of the organic substrate in proximity to a second end of the cavity.

* * * * *